United States Patent
Lu et al.

(10) Patent No.: US 12,426,193 B2
(45) Date of Patent: Sep. 23, 2025

(54) FRAME MECHANISM AND BOARD CARD MODULE

(71) Applicant: Fulian Precision Electronics (Tianjin) Co., LTD., Tianjin (CN)

(72) Inventors: Wen-Hu Lu, Tianjin (CN); Shu-Tong Wang, Tianjin (CN); Li-Yi Yin, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 174 days.

(21) Appl. No.: 18/379,421

(22) Filed: Oct. 12, 2023

(65) Prior Publication Data

US 2024/0341050 A1      Oct. 10, 2024

(30) Foreign Application Priority Data

Apr. 7, 2023   (CN) ............ 202310372102.5

(51) Int. Cl.
*H05K 7/14* (2006.01)
*G06F 1/18* (2006.01)

(52) U.S. Cl.
CPC ......... *H05K 7/1427* (2013.01); *G06F 1/185* (2013.01); *H05K 7/1401* (2013.01); *H05K 7/1418* (2013.01); *H05K 7/1461* (2013.01)

(58) Field of Classification Search
CPC .. H05K 5/0017; H05K 5/0217; H05K 7/1427; H05K 7/1401; H05K 7/1418; H05K 7/1461; G06F 1/185
USPC ........ 361/752, 755, 796, 800, 807, 809, 810
See application file for complete search history.

(56) References Cited

U.S. PATENT DOCUMENTS

| | | | | |
|---|---|---|---|---|
| 5,544,006 | A * | 8/1996 | Radloff ................. | G06F 1/186 |
| | | | | 361/756 |
| 7,545,650 | B2 * | 6/2009 | Sanchez ................. | G06F 1/186 |
| | | | | 361/801 |
| 10,624,226 | B1 * | 4/2020 | Alvarado ............. | H05K 7/1408 |
| 2011/0103012 | A1 * | 5/2011 | Kuo ....................... | G06F 1/183 |
| | | | | 361/679.58 |
| 2011/0116229 | A1 * | 5/2011 | Hsieh ..................... | G06F 1/185 |
| | | | | 361/679.58 |
| 2014/0347832 | A1 | 11/2014 | Li | |
| 2020/0343657 | A1 | 10/2020 | Wang et al. | |
| 2023/0103941 | A1 * | 4/2023 | Tsorng ................. | H05K 7/1487 |
| | | | | 361/679.01 |

FOREIGN PATENT DOCUMENTS

| | | |
|---|---|---|
| CN | 105183087 A | 12/2015 |
| CN | 111857252 A | 10/2020 |
| TW | 201446104 A | 12/2014 |

* cited by examiner

*Primary Examiner* — Hung S. Bui
(74) *Attorney, Agent, or Firm* — ScienBiziP, P.C.

(57) ABSTRACT

Disclosed in the present disclosure is a frame mechanism and a board card module. The frame mechanism includes a frame body and a fixing bracket, a baffle piece of the frame body is configured to fix a front end of the board card, the fixing bracket moves relative to the frame body, and the fixing bracket fixes a rear end of the board card. A first limiting portion of the frame body and a second limiting portion of the fixing bracket form a limit fit to lock the fixing bracket onto the frame body, when the fixing bracket moves, the first limiting portion and the second limiting portion are in an unlocked state, the fixed bracket rotates relative to the frame body.

17 Claims, 6 Drawing Sheets

FRAME MECHANISM AND BOARD CARD MODULE

FIELD

The present disclosure relates to the technical field of server technology, in particular to a frame mechanism and a board card module.

BACKGROUND

Board cards are often installed in the server to expand the server. For example, the board and a motherboard in the system are assembled into a module by means of a frame and then installed into the system, one end of the frame is provided with a baffle piece, the baffle piece is able to fix a front end of the board, while a back end of the board is suspended, so there is a risk of signal loss and damage to the board card in the event of vibration and dropping.

The current solution is to add another baffle piece, and the another baffle piece is installed on the frame through a screw. However, this method is cumbersome and unreliable, and does not facilitate tool-less disassembly of the board card.

Therefore, improvement is desired.

DETAILED DESCRIPTION

The technical solutions in the embodiments of the present disclosure will be described below in conjunction with the accompanying drawings in the embodiments of the present disclosure, and it is clear that the embodiments described are only a portion of the embodiments of the present disclosure and not all of them.

It should be noted that when an element is considered to be "connected" to another element, it may be directly connected to the other element or there may be both centered elements. When an element is considered to be "disposed on" another element, it may be disposed directly on the other element or there may be both centered elements.

Unless otherwise defined, all technical and scientific terms used herein have the same meaning as commonly understood by those skilled in the art belonging to the present disclosure. The terms used herein in the specification of the present disclosure are used only for the purpose of describing specific embodiments and are not intended to limit the present disclosure. The terms "including" and "having" and any variations thereof in the specification and claims of the present disclosure and in the foregoing description of the drawings are intended to cover non-exclusive inclusion.

In the description of the embodiments of the present disclosure, the technical terms "first", "second" and the like are only used to distinguish different objects and are not to be construed as indicating or implying a relative importance or implicitly specifying a number, a particular order, or a primary and secondary relationship of the technical features indicated. In the description of embodiments of the present disclosure, "plurality" means more than two, unless otherwise expressly and specifically limited.

It should be noted that the thickness, length, width, and other dimensions of the various components of the embodiments of the present disclosure, as well as the overall thickness, length, width, and other dimensions of the integrated device, shown in the accompanying drawings, are merely exemplary illustrations and should not constitute any limitation of the present disclosure.

The embodiment of the present disclosure provides a frame mechanism, the frame mechanism includes a frame body and a fixing bracket, the frame body is used to accommodate a board card, the frame body has a first end and a second end opposite each other, and the frame body includes a baffle piece, the baffle piece is disposed at the first end, and the baffle piece is used to fix a front end of the board card. The fixing bracket is rotatably disposed at the second end, the fixing bracket moves relative to the frame body, and the fixing bracket is used to fix a rear end of the board card, the frame body includes a first limiting portion, the fixing bracket includes a second limiting portion, the first limiting portion and the second limiting portion form a limit fit to lock the fixing bracket onto the frame body. When the fixing bracket is moved so that the first limiting portion and the second limiting portion are in an unlocked state, the fixed bracket rotates relative to the frame body.

The frame mechanism of the present disclosure, by movably setting the fixing bracket to the frame body, allows the fixing bracket to be switched between a locked state or an unlocked state at a position close to the rear end of the board card. When the fixing bracket is in the locked state, it can fix the rear end of the board card, at this time the front end and the rear end are fixed by the baffle piece and the fixing bracket respectively, avoiding the front end or the rear end is in the suspended state, in order to improve the stability of the installation of the board card. The board card is less likely to fall out of the frame mechanism under vibration and dropping. When the fixing bracket is in the unlocked state, the rear end of the board card is unlocked and can be removed from the frame body. In addition, the present disclosure forms a limit fit between the first limiting portion and the second limiting portion by moving the fixing bracket, so that the fixing bracket is in a locked state, thereby limiting the rotation of the fixing bracket; the present disclosure may also move the second limiting portion in a direction away from the first limiting portion, so that the first limiting portion and the second limiting portion are released from the limit fit, thereby switching the fixing bracket from a locked state to an unlocked state. In the unlocked state, the fixing bracket is free to rotate so as to facilitate the removal of the board card from the frame body or the loading of the board card into the fixing bracket. When the board card is installed in the frame body or removed from the frame body, just slide the fixing bracket, the fixed bracket is in the unlocked state, the operation is simple, and do not need to use tools, easy to pick up and put down the board card.

Embodiments of the present disclosure are further described below in conjunction with the accompanying drawings.

Figure 1:
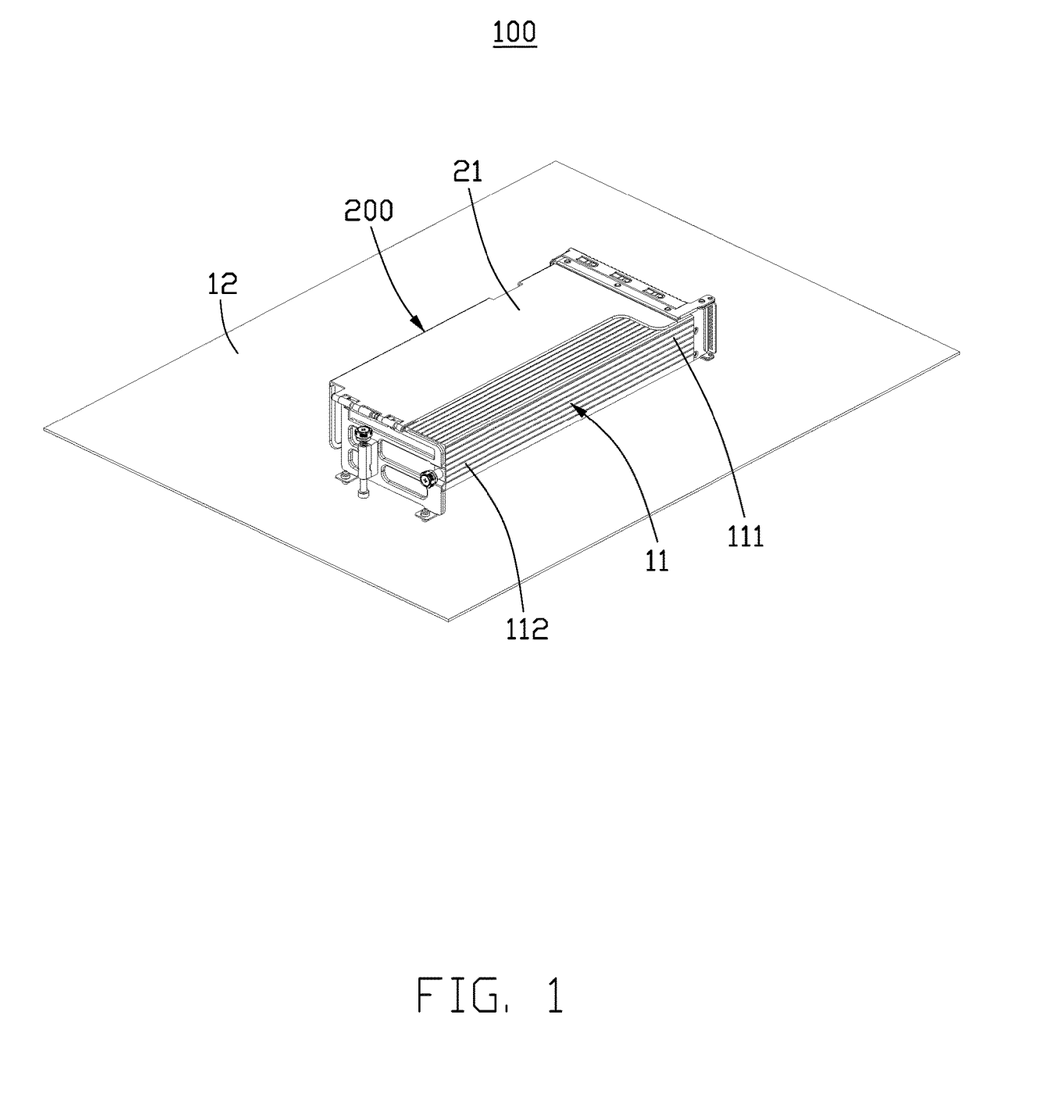
FIG. 1 is a scene diagram of a board card module according to an embodiment of the present disclosure.
Figure 2:
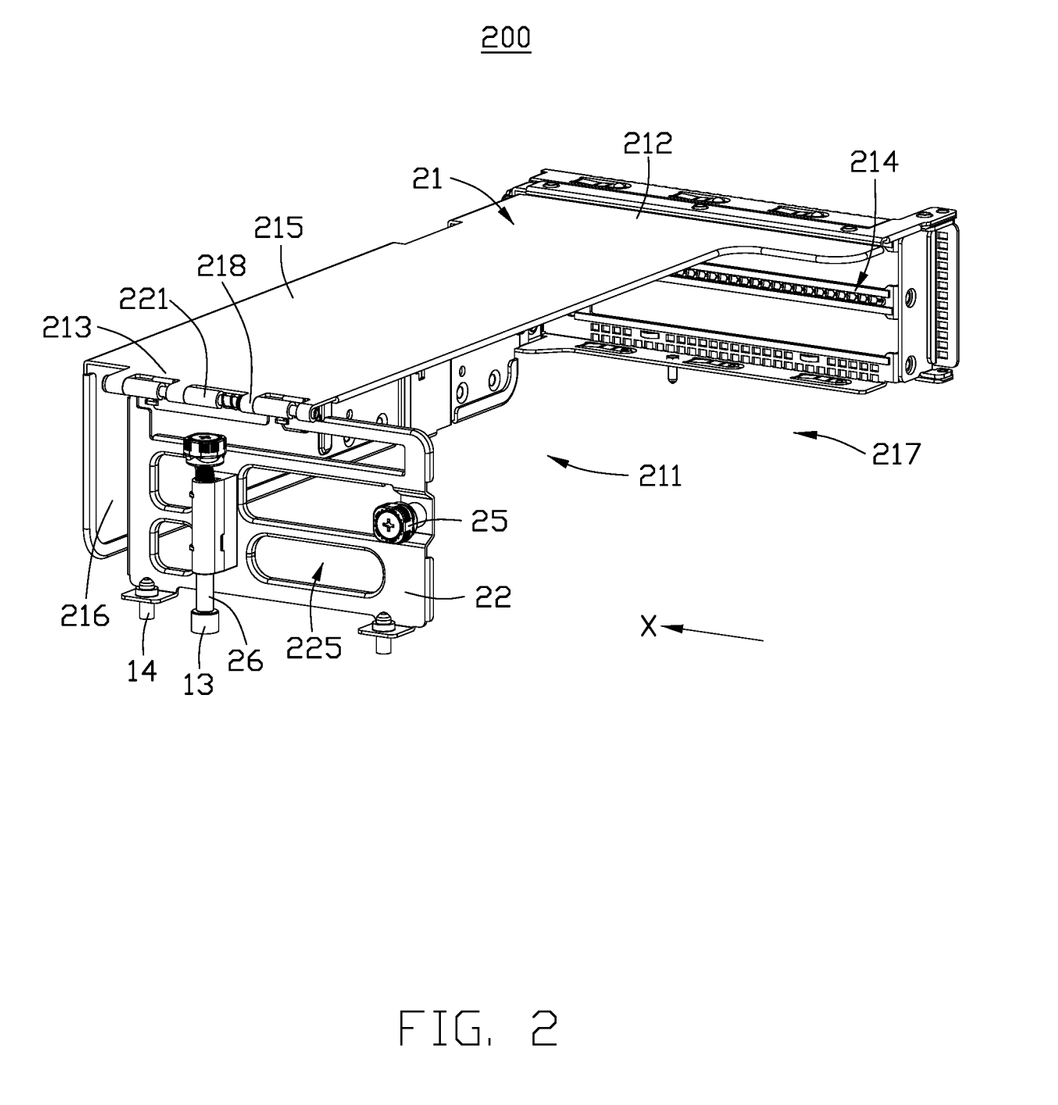
FIG. 2 is a schematic diagram of a frame mechanism according to an embodiment of the present disclosure.

FIGS. 1 and 2 illustrate a board card module 100 in accordance with an embodiment of the present disclosure.

The board card module 100 includes a board card 11 and a frame mechanism 200. The board card 11 is disposed on the frame mechanism 200.

In one embodiment, the board card 11 is a Graphics Processing Unit (GPU) card, the board card 11 shown in FIG. 1 is a GPU card. In other embodiments, the board card 11 may be a Peripheral Component Interconnect Express (PCIe) card.

In the embodiment, the frame mechanism 200 includes a frame body 21 and a fixing bracket 22. The fixing bracket 22 is disposed on the frame body 21, the fixing bracket 22 is rotatably disposed in the frame body 21, and can move relative to the frame body 21, so that the fixing bracket 22 can be locked onto the frame body 21.

The frame body 21 is used for accommodating the board card 11, the frame body 21 includes an accommodating cavity 211, a first end 212, and a second end 213, and the accommodating cavity 211, the first end 212, and the second end 213 are interconnected. The board card 11 is disposed in the accommodating cavity 211, and the first end 212 and the second end 213 are disposed opposite each other. The frame body 21 includes a baffle piece 214, and the baffle piece 214 is disposed on the first end 212. The board card 11 includes a front end 111 and a rear end 112, and the front end 111 and the rear end 112 are disposed opposite each other. The is used to fix the front end 111 of the board card 11, and the fixing bracket 22 is used to fix the rear end 112 of the board card 11, so as to avoid the front end 111 or the rear end 112 of the board card 11 from being in an overhanging state, so as to improve the installation stability of the board card 11, under vibration and falling conditions, the board card 11 is not easily detached from the frame mechanism 200.

As shown in FIG. 1 and FIG. 2, in one embodiment, the frame body 21 further includes a first sidewall 215 and a second sidewall 216, and the first sidewall 215 and the second sidewall 216 are perpendicular to each other, roughly arranged in an L-shaped structure. The opposing ends of the first sidewall 215 are a first end 212 and a second end 213, respectively. The first sidewall 215 and the second sidewall 216 enclose to form two openings opposite each other, the two openings being in communication with the accommodating cavity 211, one opening is close to the first end 212, and another opening is close to the second end 213. The edge of the baffle piece 214 is connected to the first end 212 of the first sidewall 215 and the edge of the second sidewall 216 near the first end 212, the fixing bracket 22 is disposed on the second end 213, the first sidewall 215, the second sidewall 216, the baffle piece 214, and the fixing bracket 22 can be enclosed to form the accommodating cavity 211, and the board card 11 can enter or be taken out of the accommodating cavity 211 from the opening of the second end 213.

As shown in FIG. 1 and FIG. 2, in one embodiment, the frame body 21 defines a mounting port 217, the mounting port 217, the opening at the first end 212 is communicated with the accommodating cavity 211. The mounting port 217 is disposed on the opposite side of the second sidewall 216, and the size of the mounting port 217 is roughly the same as the size of the second sidewall 216. The board card 11 is able to enter the accommodating cavity 211 through the openings at the mounting port 217 and the first end 212, enlarging the entrance of the board card 11 into the accommodating cavity 211, thereby making it easier to pick up and place the board card 11.

In one embodiment, the fixing bracket 22 can rotate to the second end 213 and move relative to the frame body 21 to open or close the opening at the second end 213. As shown in FIG. 2, the fixing bracket 22 is rotatably connected to the second end 213 of the first sidewall 215. Alternatively, in another embodiment, the fixing bracket 22 is rotatably connected to the side of the second sidewall 216 near the second end 213.

In an application scenario, the present disclosure can open or close the opening at the second end 213 by rotating and moving the fixing bracket 22. When the opening at the second end 213 is opened, it is convenient for the board card 11 to enter or remove from the accommodating cavity 211. When the opening at the second end 213 is closed, the fixing bracket 22 can fix the board card 11, thereby avoiding the board card 11 from detaching from the accommodating cavity 211 of the frame body 21 from the opening at the second end 213.

Figure 3:
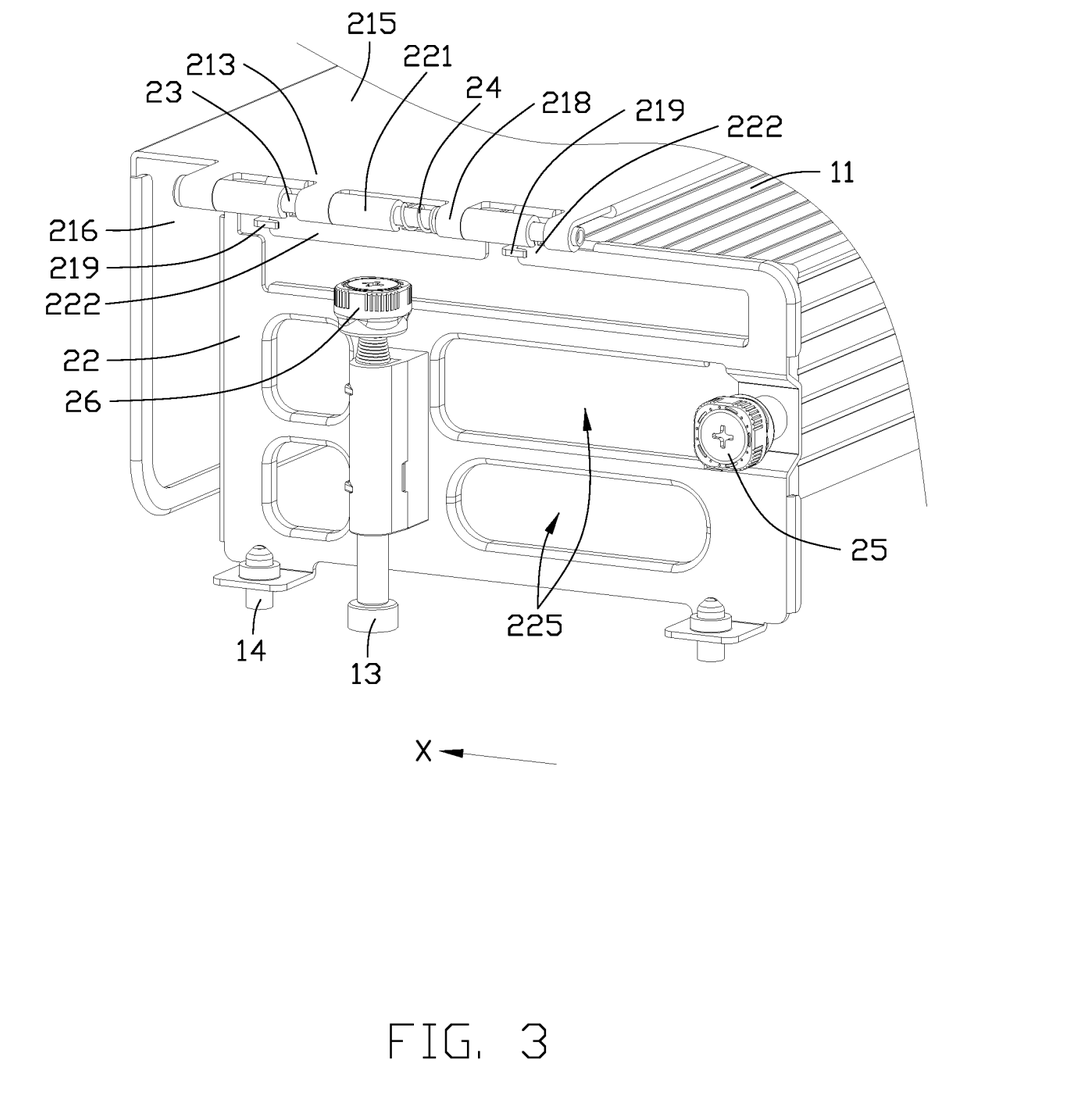
FIG. 3 is a partial schematic diagram of a frame in a locked state according to an embodiment of the present disclosure.
Figure 4:
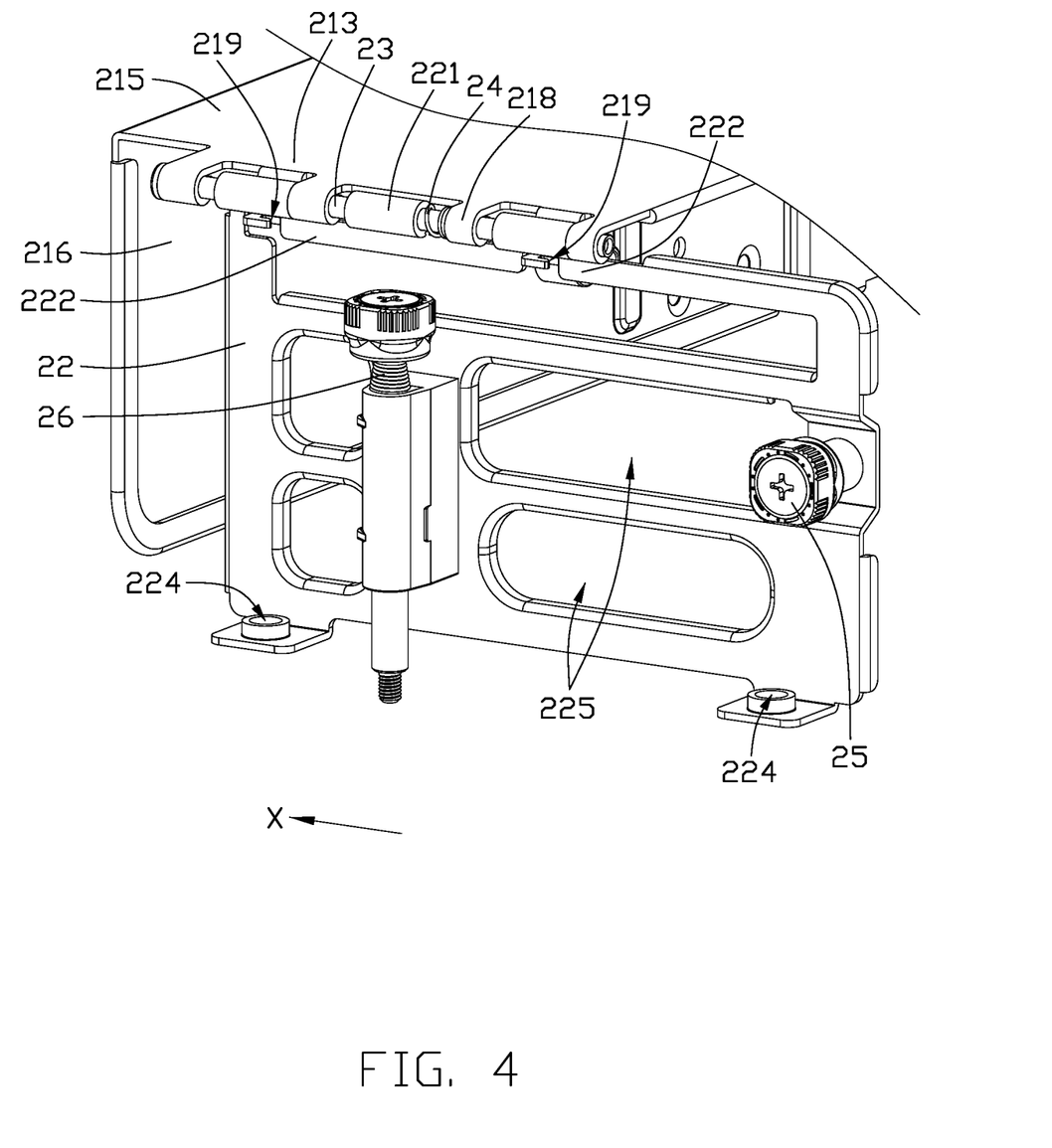
FIG. 4 is a partial schematic diagram of the frame in an unlocked state according to an embodiment of the present disclosure.

As shown in FIGS. 2, 3, and 4, in one embodiment, the frame body 21 includes a first mounting portion 218, the fixing bracket 22 includes a second mounting portion 221, and the first mounting portion 218 and the second mounting portion 221 are respectively provided with through holes. The frame mechanism 200 further includes a rotation shaft 23, and the two ends of the rotation shaft 23 are rotatably connected to the frame body 21. The rotation shaft 23 passes through the through hole of the first mounting portion 218 and the through hole of the second mounting portion 221, and the fixing bracket 22 can rotate around the rotation shaft 23 and slide along the axial direction of the rotation shaft 23. The setting of the rotation shaft 23 allows the fixing bracket 22 to switch between the locked and unlocked states, making it easier to open or close the opening at the second end 213.

As shown in FIG. 3, the first mounting portion 218 is located at the second end 213 of the first sidewall 215, and the second mounting portion 221 is located at the fixing bracket 22 near the second end 213. Alternatively, the first mounting portion 218 is located at the edge of the second sidewall 216 near the fixing bracket 22, and the second mounting portion 221 is located at the edge of the fixing bracket 22 near the second sidewall 216.

As shown in FIGS. 2 and 3, the frame body 21 includes a second mounting portion 219, the fixing bracket 22 includes a second limiting portion 222, and the first limiting portion 219 can form a limit fit with the second limiting portion 222 to lock the fixing bracket 22 tightly to the frame body 21, at this time, the fixing bracket 22 is in a locked state. When moving the fixing bracket 22 so that the first limiting portion 219 and the second limiting portion 222 are in an unlocked state, the fixing bracket 22 can rotate, as shown in FIG. 4, at this time, the fixing bracket 22 is in an unlocked state.

As shown in FIG. 4, in one embodiment, the first limiting portion 219 is a limiting groove, and the second limiting portion 222 is a limiting piece. When the fixing bracket 22 moves, the limiting piece can enter or detach from the limiting groove to switch between the locked or unlocked state of the fixing bracket 22. For example, the limiting groove is formed at the second end 213 of the first sidewall 215, and the limiting piece is disposed the fixing bracket 22 near the second end 213.

In another embodiment, the limiting groove can be disposed at the edge of the second sidewall 216 near the fixing bracket 22, and the limiting piece is disposed at the edge of the fixing bracket 22 near the second sidewall 216.

Figure 5:
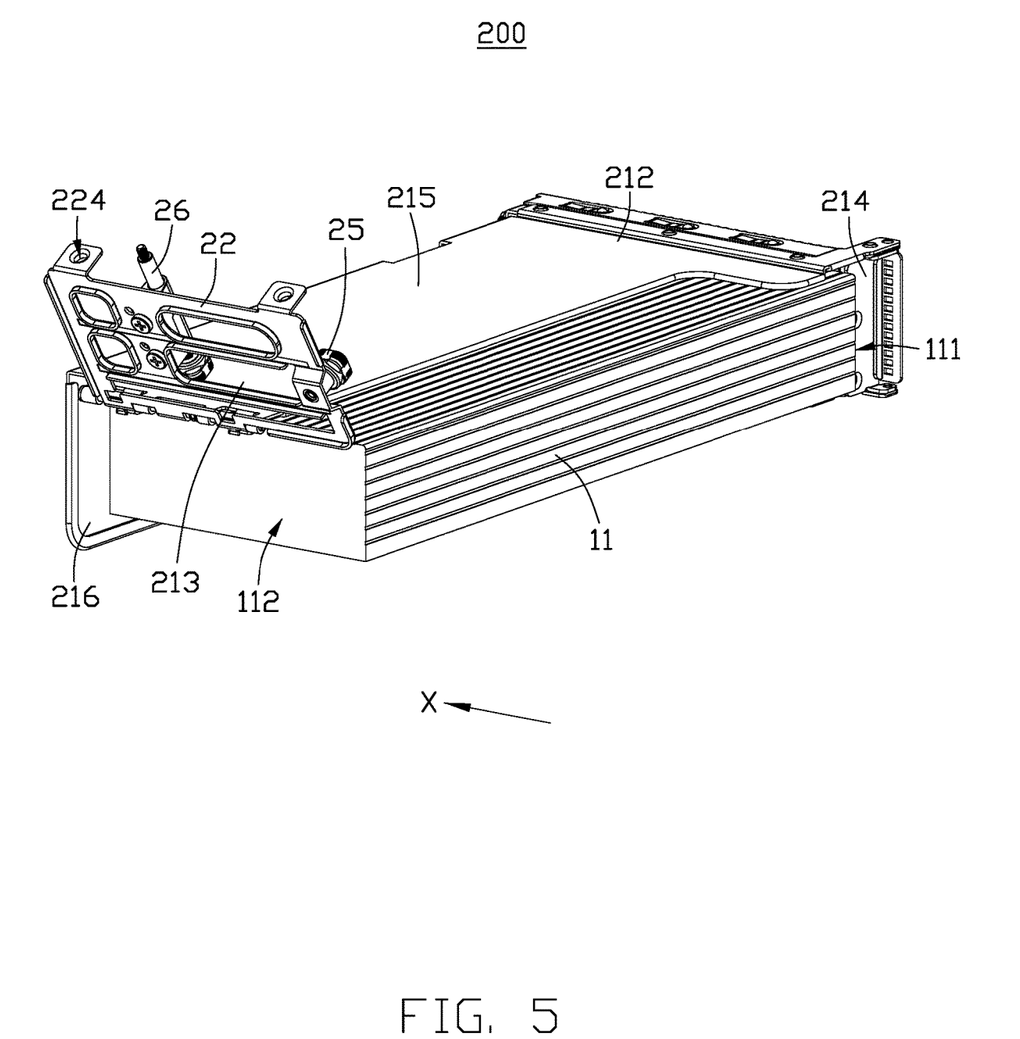
FIG. 5 is a schematic diagram of an opening at a second end of the frame mechanism in an open state according to an embodiment of the present disclosure.

As shown in FIGS. 2 and 3, when the limiting piece enters the limiting groove, the limiting piece forms a limit fit with the limiting groove, thereby limiting the rotation of the fixing bracket 22 and keeping the fixing bracket 22 in a locked state to close the opening of the second end 213. As shown in FIGS. 4 and 5, when the limiting piece detaches from the limiting groove, the fixing bracket 22 unlocks and enters an unlocked state, so that the opening of the second end 213 can be opened, facilitating the removal of the board card 11 from the opening of the second end 213.

In other embodiments, the structures of the first limiting portion 219 and the second limiting portion 222 can be replaced, the first limiting portion 219 can be a limiting piece, the second limiting portion 222 can be a limiting groove, and the limiting piece can enter the limiting groove to limit the rotation of the fixing bracket 22. In other embodiments, the first limiting portion 219 and the second limiting portion 222 can also be replaced with other structures that can perform equivalent functions. For example, in one embodiment, the first limiting portion 219 is a limiting block (not shown in the figure), the second limiting portion 222 is a limiting plate (not shown in the figure), and the limiting plate defines a sliding groove. The length direction of the sliding groove is consistent with the axial direction of the rotation shaft 23, as the limiting plate slides, the limiting block can enter or leave the sliding groove. When the limiting block is located at the sliding groove, it can limit the rotation of the fixing bracket 22, so that the fixing bracket 22 is in a locked state. When the limiting block disengages from the sliding groove, the fixing bracket 22 is in an unlocked state, and the fixing bracket 22 can rotate around the rotation shaft 23.

The fixing bracket 22 can slide relative to the frame body 21 through the rotation shaft 23, so that the first limiting portion 219 can approach or move away from the second limiting portion 222, thereby enabling the fixing bracket 22 to switch between the locked state and the unlocked state.

The present disclosure can slide the fixing bracket 22 along the axial direction of the rotation shaft 23, which can make the first limiting portion 219 and the second limiting portion 222 approach to each other and form a limit fit, so that the fixing bracket 22 is in a locked state, thereby limiting the rotation of the fixing bracket 22. The present disclosure can slide the second limiting portion 222 away from the first limiting portion 219 in a direction that releases the limit fit between the first limiting portion 219 and the second limiting portion 222, thereby switching the fixing bracket 22 from a locked state to an unlocked state.

As shown in FIGS. 2 and 3, the fixing bracket 22 defines multiple heat dissipation holes 225, and the heat dissipation holes 225 may be irregularly shaped. In some embodiments, the number of the heat dissipation holes 225 can be one or multiple. When the board card module 100 is in operation, the temperature of the board card 11 will gradually increase, and the setting of the heat dissipation holes 225 is conducive to the heat dissipation of the board card 11.

In one embodiment, the frame mechanism 200 further includes an elastic reset member 24, one end of the elastic reset member 24 can press against the first mounting portion 218, and another end of the elastic reset member 24 can press against the second mounting portion 221. When the first limiting portion 219 and the second limiting portion 222 are away from each other, the elastic reset member 24 gradually compresses, thereby generating an elastic force for driving the second limiting portion 222 closer to the first limiting portion 219.

After the two ends of the elastic reset member 24 are respectively pressed against the first mounting portion 218 and the second mounting portion 221, the elastic reset member 24 has a tendency to be compressed, so that the second limiting portion 222 on the fixing bracket 22 has a tendency to approach the first limiting portion 219. When the fixing bracket 22 is in a locked state, the elastic reset member 24 drives the second limiting portion 222 to form a limit fit with the first limiting portion 219, thereby improving the stability of the fixing bracket 22 in the locked state.

When the elastic reset member 24 is gradually compressed, the elastic force of the elastic reset member 24 gradually increases, and the elastic force of the elastic reset member 24 can drive the second limiting portion 222 close to the first limiting portion 219, so that the fixing bracket 22 has a tendency to transition to a locked state when in an unlocked state. Therefore, when the fixing bracket 22 is not subjected to external forces, the second limiting portion 222 will slide with the fixing bracket 22 towards the direction close to the first limiting portion 219 under the elastic force of the elastic reset member 24, thereby switching the fixing bracket 22 from an unlocked state to a locked state, without the need for manual locking, making the operation more convenient.

As shown in FIGS. 2, 3, and 4, in one embodiment, the elastic reset member 24 is a spring, and the spring is sleeved on the rotation shaft 23. The assembly method of the spring and the rotation shaft 23 is simple, and the spring is not easily separated from the rotation shaft 23. When the first limiting portion 219 is far away from the second limiting portion 222, one end of the spring is pressed against the first mounting portion 218, another end of the spring is pressed against the second mounting portion 221, and gradually compressing. The elastic force of the spring can drive the first limiting portion 219 and the second limiting portion 222 closer to each other, thereby causing the fixing bracket 22 to slide along the rotation shaft 23. In other words, the spring can push the fixing bracket 22 to slide under the action of elasticity, so as to facilitate the switch from the unlocked state to the locked state of the fixing bracket 22.

In other embodiments, the elastic reset member 24 can be other structures with equivalent functions or effects, for example, the elastic reset member 24 can be an elastic rubber tube, and the elastic rubber tube is sleeved on the rotation shaft 23. The elastic reset member 24 can also be other components with elastic reset function.

Figure 6:
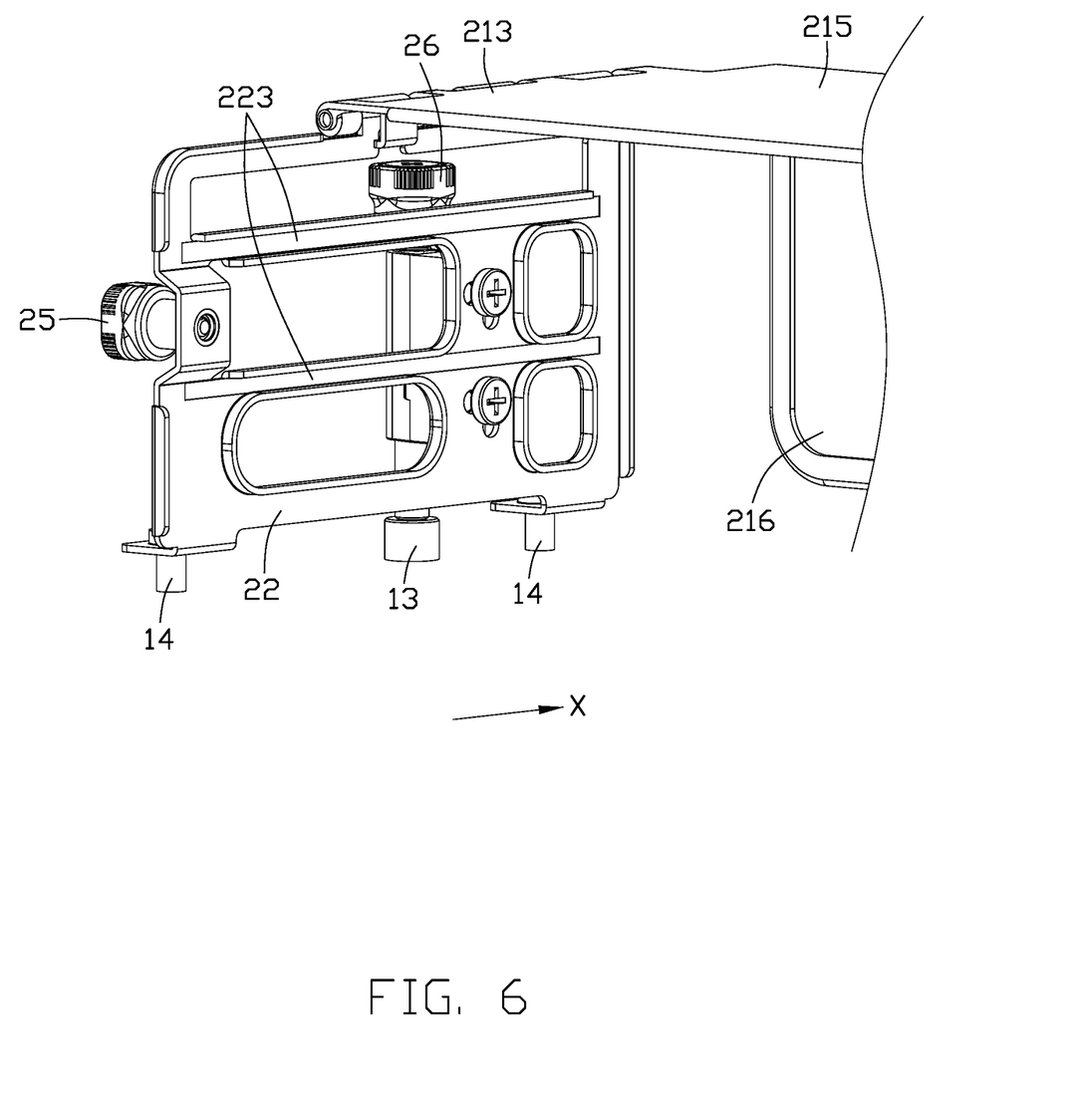
FIG. 6 is a schematic diagram for displaying the frame mechanism according to an embodiment of the present disclosure.

As shown in FIGS. 5 and 6, in one embodiment, one side of the fixing bracket 22 facing the baffle piece 214 can define a sliding groove 223, and an inner wall of the sliding groove 223 can be clamped on the rear end 112 of the board card 11. When the board card 11 is a PCIe card, the rear end 112 of the PCIe card has a clamping plate (not shown in the figure) for mating with the sliding groove 223. When the rear end 112 of the PCIe card is accommodated in the sliding groove 223, the fixing bracket 22 can fix the rear end 112 of the PCIe card, and provide support for the PCIe card, thereby improving the installation stability of the PCIe card.

The number of the sliding grooves 223 can be one or multiple, for example, two sliding groove 223 are disposed in parallel.

In one embodiment, the length direction of the sliding groove 223 is consistent with the axial direction of the rotation shaft 23, which is the X-axis direction shown in the figure. When the board card 11 is entered into the accommodating cavity 211 from the mounting port 217, the PCIe card enters the sliding groove 223 along the X-axis direction, during this process, the clamping plate of the rear end 112 of the PCIe card moves along the length direction of the sliding groove 223 and enters the sliding groove 223, and the sliding groove provides guidance for the PCIe card.

As shown in FIGS. 2, 5, and 6, in one embodiment, the frame mechanism 200 further includes a locking member 25, the locking member 25 passes through the fixing bracket 22, and the locking member 25 can be pressed against the rear end 112 of the board card 11. When the fixing bracket 22 is in a locked state, the locking member 25 is pressed against the rear end 112 of the board card 11, to clamp the board card 11 between the baffle piece 214 and the locking element 25, making it difficult for the board card 11 to move between the baffle piece 214 and the fixing bracket 22, further improving the installation stability of the board card 11.

As shown in FIGS. 2, 5, and 6, in one embodiment, the locking member 25 is a thumb screw, the thumb screw is perpendicular to the fixing bracket 22, and is threaded to the fixing bracket 22. The present disclosure can be used to turn the thumb screw to be able to move the thumb screw relative to the fixing bracket 22 and to be able to press against the rear end 112 of the board card 11. In other embodiments, the locking member 25 can be a bolt or a pin.

As shown in FIGS. 1 and 2, in one embodiment, the board card module 100 further includes a mounting plate 12, and the frame mechanism 200 is disposed on the mounting plate 12. The frame mechanism 200 further includes a first connecting member 26, the mounting plate 12 includes a second connecting member 13, and the first connecting member 26 and the second connecting member 13 can be detachably connected. The present disclosure can fix the frame mechanism 200 on the mounting plate 12 by connecting the first connecting member 26 with the second connecting member 13 and can separate the frame mechanism 200 from the mounting plate 12 by disconnecting the first connecting member 26 from the second connecting member 13, thereby facilitating the disassembly and assembly of the frame mechanism 200 and the mounting plate 12.

As shown in FIGS. 1 and 2, in one embodiment, the first connecting member 26 is a long rod screw, and the first connecting member 26 is disposed on the fixing bracket 22. The second connecting member 13 is a nut, and the long rod screw is threaded to the nut. The present disclosure can fix the frame mechanism 200 on the mounting plate 12 by rotating the long rod screw so that the long rod screw is threaded with the nut, the present disclosure can release the connection between the long rod screw and the nut by rotating the long rod screw, to facilitate the disassembly and assembly of the frame mechanism 200 and the mounting plate 12.

In another embodiment, the first connecting member 26 and the second connecting member 13 are two locking buckles (not shown in the figure) that can be interlocked with each other, and the frame mechanism 200 is connected to the mounting plate 12 through the locking buckle. Alternatively, the first connecting member 26 and the second connecting member 13 are adhesive pieces, and the first connecting member 26 and the second connecting member 13 can be bonded to each other to connect the frame mechanism 200 to the mounting plate 12.

As shown in FIGS. 1, 2 and 5, in one embodiment, the mounting plate 12 is equipped with a first positioning portion, and the fixing bracket 22 is equipped with a second positioning portion. The first positioning portion and the second positioning portion are connected to locate the fixing bracket 22 on the mounting plate 12. For example, in one embodiment, the first positioning portion is a positioning pillar 14, the second positioning portion is a positioning hole 224, and the positioning pillar 14 can be inserted into the positioning hole 224. When assembling the frame mechanism 200 and the mounting plate 12, first thread the positioning pillar 14 into the positioning hole 224 to achieve the pre-positioning of the frame mechanism 200, the first connecting member 26 is then connected to the second connecting member 13 by turning the first connecting member 26, thereby completing the assembly of the frame mechanism 200 with the mounting plate 12.

The number of the positioning pillars 14 is the same as the number of the positioning holes 224 and corresponds one-to-one. For example, in one embodiment, there are two positioning pillars 14 and two positioning holes 224.

When assembling the board card 11 with the frame body 21, first flip the fixing bracket 22 so that the opening at the second end 213 is in an open state, and load the board card 11 into the accommodating cavity 211 from the opening at the second end 213 or load the board card 11 into the accommodating cavity 211 from the mounting port 217 along the X-axis direction, and then the fixing bracket 22 is rotated in the reverse direction to close the opening at the second end 213. After the fixing bracket 22 is rotated to close the opening of the second end 213, the external force applied to the fixing bracket 22 is released, the fixing bracket 22 is reset under the action of the elastic reset member 24, so that the first limiting portion 219 and the second limiting portion 222 are close to each other to form a limit fit, thereby causing the fixing bracket 22 to be in a locked state. Then press the locking member 25 against the rear end 112 of the board card 11. When the fixing bracket 22 switches from the locked state to the unlocked state, first move the locking member 25 away from the board card 11 to release the locking member 25 from the board card 11, then push the fixing bracket 22 to move the second limiting portion 222 away from the first limiting portion 219, thereby releasing the limit fit between the first limiting portion 219 and the second limiting portion 222, and the fixing bracket 22 can be rotated to open the opening of the second end 213.

In the board card module 100, the fixing bracket 22 can rotate in an unlocked state to facilitate opening or closing the opening of the second end 213. The fixing bracket 22 can be combined with the baffle piece 214 to fix the board card 11 in a locked state, thereby improving the installation stability of the board card 11. When the board card 11 is installed on or removed from the frame body 21, simply slide the fixing bracket 22 to release the lock of the fixing bracket 22 for easy opening or closing of the opening at the second end 213. The operation is simple and does not require the use of tools, making it easy to retrieve and place the board card 11.

Those of ordinary skill in the art should realize that the above embodiments are only used to illustrate the present disclosure, but not to limit the present disclosure. As long as they are within the essential spirit of the present disclosure, the above embodiments are appropriately made, and changes fall within the scope of protection of the present disclosure.

What is claimed is:
1. A frame mechanism comprising:
a frame body configured for accommodating a board card, wherein the frame body has a first end and a second end opposite each other, and the frame body comprises a baffle piece, the baffle piece is disposed at the first end, and the baffle piece is configured to fix a front end of the board card;

a fixing bracket rotatably disposed at the second end, wherein the fixing bracket moves relative to the frame body, and the fixing bracket is configured to fix a rear end of the board card, wherein the frame body further comprises a first limiting portion, the fixing bracket comprises a second limiting portion, the first limiting portion and the second limiting portion form a limit fit to lock the fixing bracket onto the frame body, and when the fixing bracket moves so that the first limiting portion and the second limiting portion are in an unlocked state, the fixed bracket rotates relative to the frame body; and wherein one side of the fixing bracket facing the baffle piece defines a sliding groove, and an inner wall of the sliding groove grips the rear end of the board card, and when the rear end of the board card moves along a length direction of the sliding groove and enters the sliding groove, the sliding groove is configured to guide the board card.

2. The frame mechanism of claim 1, wherein the first limiting portion is a limiting groove, and the second limiting portion is a limiting piece.

3. The frame mechanism of claim 2, wherein when the fixing bracket moves, the limiting piece enters or disengages from the limiting groove to switch the fixing bracket between a locked state or the unlocked state.

4. The frame mechanism of claim 1, wherein the frame body further comprises a first mounting portion, the fixing bracket further comprises a second mounting portion, the first mounting portion defines a first through hole, and the second mounting portion defines a second through hole, the frame mechanism further comprises a rotation shaft, the rotation shaft passes through the first through hole of the first mounting portion and the second through hole of the second mounting portion, the fixing bracket rotates with the rotation shaft as a rotation center and slides along an axial direction of the rotation shaft.

5. The frame mechanism of claim 4, wherein the frame mechanism further comprises an elastic reset member, one end of the elastic reset member presses against the first mounting portion and another end of the elastic reset member presses against the second mounting portion.

6. The frame mechanism of claim 5, wherein when the first limiting portion and the second limiting portion are away from each other, the elastic reset member compresses, thereby generating elastic force for driving the second limiting portion closer to the first limiting portion.

7. The frame mechanism of claim 6, wherein the elastic reset member is a spring, and the spring is sleeved on the rotation shaft.

8. The frame mechanism of claim 1, wherein the frame mechanism further comprises a locking member, the locking member passes through the fixing bracket, and the locking member is pressed against the rear end of the board card.

9. A board card module comprising:
a board card; and
a frame mechanism comprising:
  a frame body configured for accommodating a board card, wherein the frame body has a first end and a second end opposite each other, and the frame body comprises a baffle piece, the baffle piece is disposed at the first end, and the baffle piece is configured to fix a front end of the board card, wherein the board card is disposed on the frame body;

a fixing bracket rotatably disposed at the second end, wherein the fixing bracket moves relative to the frame body, and the fixing bracket is configured to fix a rear end of the board card, wherein the frame body further comprises a first limiting portion, the fixing bracket comprises a second limiting portion, the first limiting portion and the second limiting portion form a limit fit to lock the fixing bracket onto the frame body, and wherein when the fixing bracket moves so that the first limiting portion and the second limiting portion are in an unlocked state, the fixed bracket rotates relative to the frame body; and wherein one side of the fixing bracket facing the baffle piece defines a sliding groove, and an inner wall of the sliding groove grips the rear end of the board card, and when the rear end of the board card moves along a length direction of the sliding groove and enters the sliding groove, the sliding groove is configured to guide the board card.

10. The board card module of claim 9, wherein the board card module further comprises a mounting plate, and the frame mechanism is disposed on the mounting plate, the frame mechanism further comprises a first connecting member, the mounting plate comprises a second connecting member, the first connecting member is detachably connected to the second connecting member.

11. The board card module of claim 10, wherein the mounting plate further comprises a first positioning portion, the fixing bracket further comprises a second positioning portion, and the first positioning portion is connected to the second positioning portion to locate the fixing bracket on the mounting plate.

12. The board card module of claim 9, wherein the first limiting portion is a limiting groove, and the second limiting portion is a limiting piece, when the fixing bracket moves, the limiting piece enters or disengages from the limiting groove to switch the fixing bracket between a locked state or the unlocked state.

13. The board card module of claim 9, wherein the frame body further comprises a first mounting portion, the fixing bracket further comprises a second mounting portion, the first mounting portion defines a first through hole, and the second mounting portion defines a second through hole, the frame mechanism further comprises a rotation shaft, the rotation shaft passes through the first through hole of the first mounting portion and the second through hole of the second mounting portion, the fixing bracket rotates with the rotation shaft as a rotation center and slides along an axial direction of the rotation shaft.

14. The board card module of claim 13, wherein the frame mechanism further comprises an elastic reset member, one end of the elastic reset member presses against the first mounting portion and another end of the elastic reset member presses against the second mounting portion.

15. The board card module of claim 14, wherein when the first limiting portion and the second limiting portion are away from each other, the elastic reset member compresses, thereby generating elastic force for driving the second limiting portion closer to the first limiting portion.

16. The board card module of claim 15, wherein the elastic reset member is a spring, and the spring is sleeved on the rotation shaft.

17. The board card module of claim 9, wherein the frame mechanism further comprises a locking member, the locking member passes through the fixing bracket, and the locking member is pressed against the rear end of the board card.

\* \* \* \* \*